(12) United States Patent
Nishimura et al.

(10) Patent No.: US 10,734,242 B2
(45) Date of Patent: Aug. 4, 2020

(54) SUBSTRATE PROCESSING METHOD AND SUBSTRATE PROCESSING APPARATUS

(71) Applicant: TOKYO ELECTRON LIMITED, Tokyo (JP)

(72) Inventors: Kazuaki Nishimura, Yamanashi (JP); Jun Lin, Yamanashi (JP); Koji Takeya, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 102 days.

(21) Appl. No.: 15/867,453

(22) Filed: Jan. 10, 2018

(65) Prior Publication Data

US 2018/0197748 A1 Jul. 12, 2018

(30) Foreign Application Priority Data

Jan. 10, 2017 (JP) ................................. 2017-001993

(51) Int. Cl.
| | | |
|---|---|---|
| *H01L 21/311* | (2006.01) | |
| *H01L 21/677* | (2006.01) | |
| *H01L 21/66* | (2006.01) | |
| *H01J 37/32* | (2006.01) | |
| *H01L 21/67* | (2006.01) | |
| *H01L 29/66* | (2006.01) | |

(52) U.S. Cl.
CPC ... *H01L 21/31111* (2013.01); *H01J 37/32935* (2013.01); *H01J 37/32963* (2013.01); *H01J 37/32972* (2013.01); *H01J 37/32981* (2013.01); *H01L 21/31116* (2013.01); *H01L 21/67253* (2013.01); *H01L 21/67748* (2013.01); *H01L 22/24* (2013.01); *H01L 29/66795* (2013.01)

(58) Field of Classification Search
CPC .......... H01J 37/32981; H01J 37/32963; H01J 37/32972; H01J 37/32935; H01L 21/67253
See application file for complete search history.

(56) References Cited

U.S. PATENT DOCUMENTS

| | | | | |
|---|---|---|---|---|
| 6,117,348 A | * | 9/2000 | Peng | H01J 37/32935 216/59 |
| 2003/0085198 A1 | * | 5/2003 | Yi | H01J 37/32935 216/60 |
| 2003/0153102 A1 | * | 8/2003 | Chiu | H01J 37/32935 438/9 |
| 2004/0067645 A1 | * | 4/2004 | Chen | H01J 37/32935 438/689 |
| 2004/0185670 A1 | | 9/2004 | Hamelin et al. | |
| 2016/0225681 A1 | * | 8/2016 | Asakura | G01N 21/68 |
| 2017/0221740 A1 | * | 8/2017 | Ranjan | H01L 21/67023 |
| 2018/0068909 A1 | * | 3/2018 | Shiraishi | H01J 37/32082 |

* cited by examiner

*Primary Examiner* — Bac H Au
(74) *Attorney, Agent, or Firm* — Fenwick & West LLP (57) ABSTRACT

In a substrate processing method for performing predetermined processing on a substrate, which has a processing target film, accommodated in a processing chamber, as a luminous intensity of a predetermined wavelength in an emission spectrum of a plasma generated from a processing gas in the chamber, a luminous intensity of the predetermined wavelength which starts to change when actual processing of the processing target film is started is measured. Then, a processing time of the predetermined processing performed after a moment when the measured luminous intensity of the predetermined wavelength is changed, is set.

5 Claims, 12 Drawing Sheets

SUBSTRATE PROCESSING METHOD AND SUBSTRATE PROCESSING APPARATUS

CROSS-REFERENCE TO RELATED APPLICATIONS

This application claims priority to Japanese Patent Application No. 2017-001993 filed on Jan. 10, 2017, the entire contents of which are incorporated herein by reference.

FIELD OF THE INVENTION

The disclosure relates to a substrate processing method that requires etching and a substrate processing apparatus.

BACKGROUND OF THE INVENTION

As for a process for chemically etching and removing an oxide film formed on a wafer as a substrate, there is known, e.g., COR (Chemical Oxide Removal) processing (see, e.g., U.S. Patent Application Publication No. 2004/0185670). In the COR processing, the oxide film formed on a surface of the wafer is made to react with hydrogen fluoride gas and ammonia gas, and ammonium hexafluorosilicate (AFS) is generated as a reaction product from the oxide film. The generated AFS is sublimated and removed by heating the wafer. In the COR processing, the amount of AFS is increased as time elapses. Therefore, the removal amount (etching amount) of the oxide film is controlled by controlling a processing time of the COR processing.

The COR processing may be repeatedly performed on the wafer. However, it has been known that the etching amount of the oxide film in each COR processing is not uniform depending on a so-called Q-time which is a period of time from previous COR processing to current COR processing. In order to reliably etch the oxide film by a desired amount, the processing time of the COR processing is set to be longer than the processing time required for etching the oxide film by the desired amount.

However, if the processing time of the COR processing is set to be longer than the processing time required for etching the oxide film by the desired amount, the etching amount of the oxide film may exceed the desired amount and the oxide film may be etched more than required. For example, when forming a hole in the oxide film, even though the processing time is set such that the hole does not penetrate through the oxide film, the etching amount of the oxide film may exceed the desired amount and the hole may penetrate through the oxide film. Therefore, it is difficult to accurately control the etching amount of the oxide film.

SUMMARY OF THE INVENTION

In view of the above, the disclosure provides a substrate processing method and a substrate processing apparatus which can accurately control a processing amount of a processing target film.

In accordance with an aspect, there is provided a substrate processing method for performing predetermined processing on a substrate accommodated in a processing chamber, the substrate having a processing target film. The substrate processing method includes: measuring, as a luminous intensity of a predetermined wavelength in an emission spectrum of a plasma generated from a processing gas in the chamber, a luminous intensity of the predetermined wavelength which starts to change when actual processing of the processing target film is started; and setting a processing time of the predetermined processing performed after a moment when the luminous intensity of the predetermined wavelength which is measured in the measuring the luminous intensity is changed.

In accordance with another aspect, there is provided a substrate processing apparatus including a processing chamber configured to accommodate a substrate and perform predetermined processing on the substrate. The substrate processing apparatus includes: a luminous intensity measuring unit configured to measure, as a luminous intensity of a predetermined wavelength in an emission spectrum of a plasma generated from a gas in the chamber, a luminous intensity of the predetermined wavelength which starts to change when actual processing of the processing target film is started; and a processing time setting unit configured to set a processing time of the predetermined processing performed after a moment when the luminous intensity of the predetermined wavelength which is measured by the luminous intensity measuring unit is changed.

BRIEF DESCRIPTION OF THE DRAWINGS

The objects and features of the disclosure will become apparent from the following description of embodiments, given in conjunction with the accompanying drawings, in which:

FIGS. 11A and 11B are partial cross sectional views schematically showing a structure of a wafer in which a plurality of fin structures are buried in an oxide film, wherein FIG. 11A shows a case where tip end portions of fin structures are covered with the oxide film and FIG. 11B shows a case where the tip end portions of the fin structures are exposed.

DETAILED DESCRIPTION OF THE EMBODIMENTS

Hereinafter, embodiments will be described with reference to the accompanying drawings.

First, a first embodiment will be described.

Figure 1:
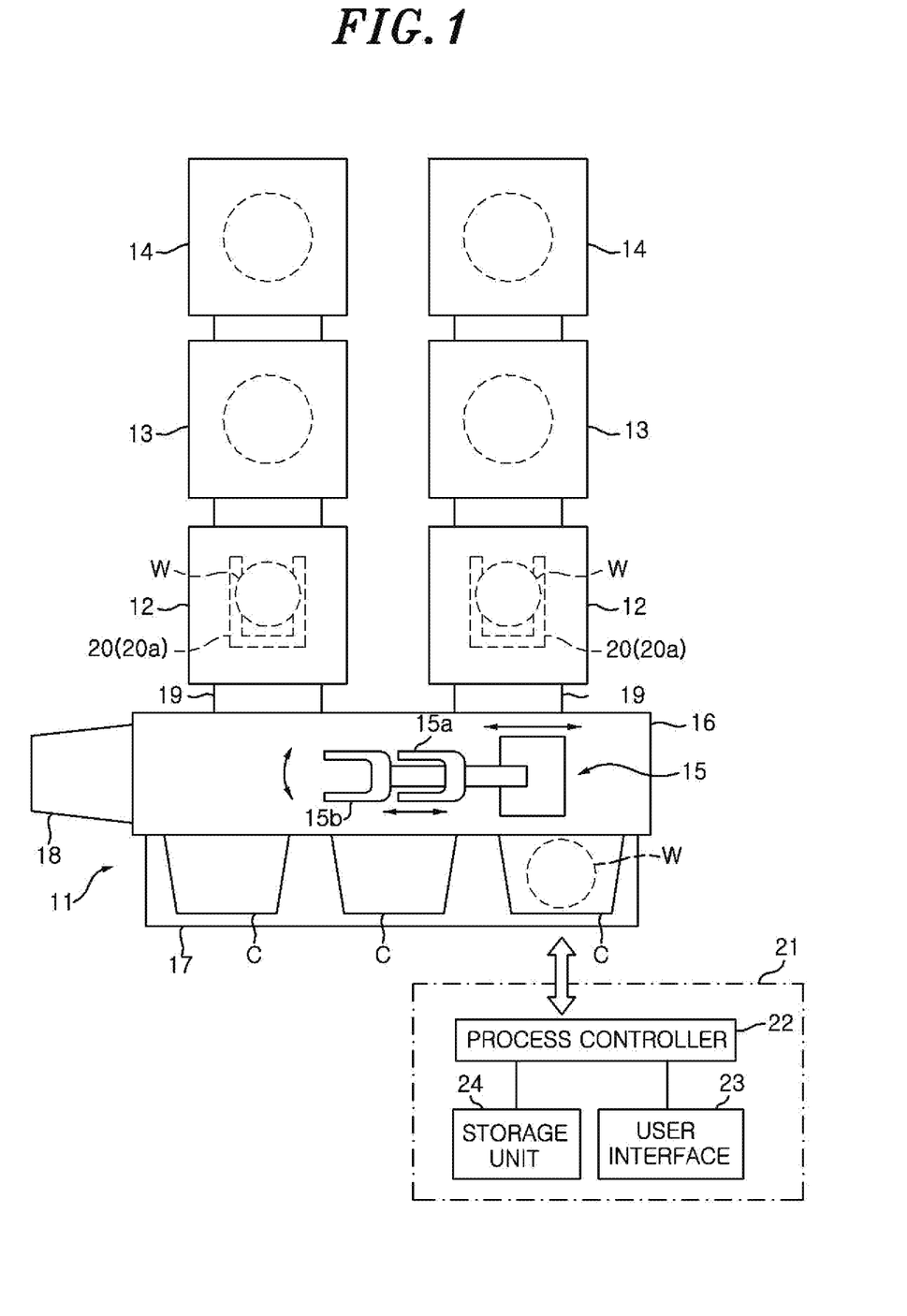
FIG. 1 is a top view schematically showing a configuration of a substrate processing system including a COR apparatus as a substrate processing apparatus according to a first embodiment.

FIG. 1 is a top view schematically showing a configuration of a substrate processing system including a COR apparatus as a substrate processing apparatus according to an embodiment.

Referring to FIG. 1, a substrate processing system 10 includes: a loader module 11 through which a disc-shaped semiconductor wafer W (hereinafter, simply referred to as "wafer") as a substrate is loaded and unloaded; two load-lock chambers 12 provided adjacent to the loader module 11; PHT (Post Heat Treatment) apparatuses 13, provided adjacent to the load-lock chambers 12, for performing PHT on wafers W; and COR apparatuses 14, provided adjacent to the PHT apparatuses 13, for performing COR process on the wafers W. In the substrate processing system 10, the load-lock chambers 12, the PHT apparatuses 13 and the COR apparatuses 14 are linearly disposed in that order.

The loader module 11 includes a rectangular parallelepiped loader chamber 16 having therein a first transfer mechanism 15. The first wafer transfer mechanism 15 has two transfer arms 15a and 15b for holding wafers W in a substantially horizontal direction. A carrier mounting table 17 is provided at one longitudinal side of the loader chamber 16. A plurality of, e.g., three, carriers C, each accommodating therein a plurality of wafers W, are placed on the carrier mounting table 13. In the loader module 11, an orienter 18 is provided adjacent to the loader chamber 12 to perform position alignment of the wafer W by optically obtaining eccentricity by rotating the wafer W.

In the loader module 11, the wafer W is moved horizontally and vertically by the transfer arms 15a and 15b. The wafer W is loaded and unloaded with respect to the carriers C, the load-lock chambers 12 and the orienter 18.

The load-lock chambers 12 are connected to the loader module 11 via gate valves 19. A second wafer transfer mechanism 20 for transferring a wafer W is provided in each of the load-lock chambers 12. Each of the load-lock chambers 12 has a gas exhaust unit and a gas introducing unit (both not shown) and can be evacuated to a predetermined vacuum level.

The second wafer transfer mechanism 20 has a multi-joint arm structure (not shown) and a U-shaped pick 20a moved by the multi-joint arm structure. The pick 20a holds the wafer W thereon. In the second wafer transfer mechanism 20, the pick 20a is positioned inside the load-lock chamber 12 in a state where the multi-joint arm is contracted and the pick 20a reaches the PHT apparatus 13 and the COR apparatus 14 by extending the multi-joint arm structure. In other words, the second wafer transfer mechanism 20 transfers the wafer W between the load-lock chambers 12, the PHT apparatuses 13 and the COR apparatuses 14.

The substrate processing system 10 further includes a control unit 21. The control unit 21 includes a process controller 22 having a microprocessor (computer), a user interface 23 and a storage unit 24. The process controller 22 controls components of the substrate processing system 10. The user interface 23 has a touch panel (not shown) used for an operator to input commands to manage the substrate processing system 10 and a display (not shown) for visually displaying operation states of the components of the substrate processing system 10. The storage unit 24 stores a control program for realizing various processes, e.g., supply of the processing gas and exhaust of a chamber 36 to be described later in the COR apparatus 15, which are executed in the substrate processing system 10, and a control program, i.e., a processing recipe, for executing predetermined operations of the components of the substrate processing system 10 based on various processing conditions, and various database. In the substrate processing system 10, the COR processing and the PHT processing are performed by controlling the operations of the components based on the processing recipe read out from the storage unit 24 under the control of the process controller 22.

Figure 2:
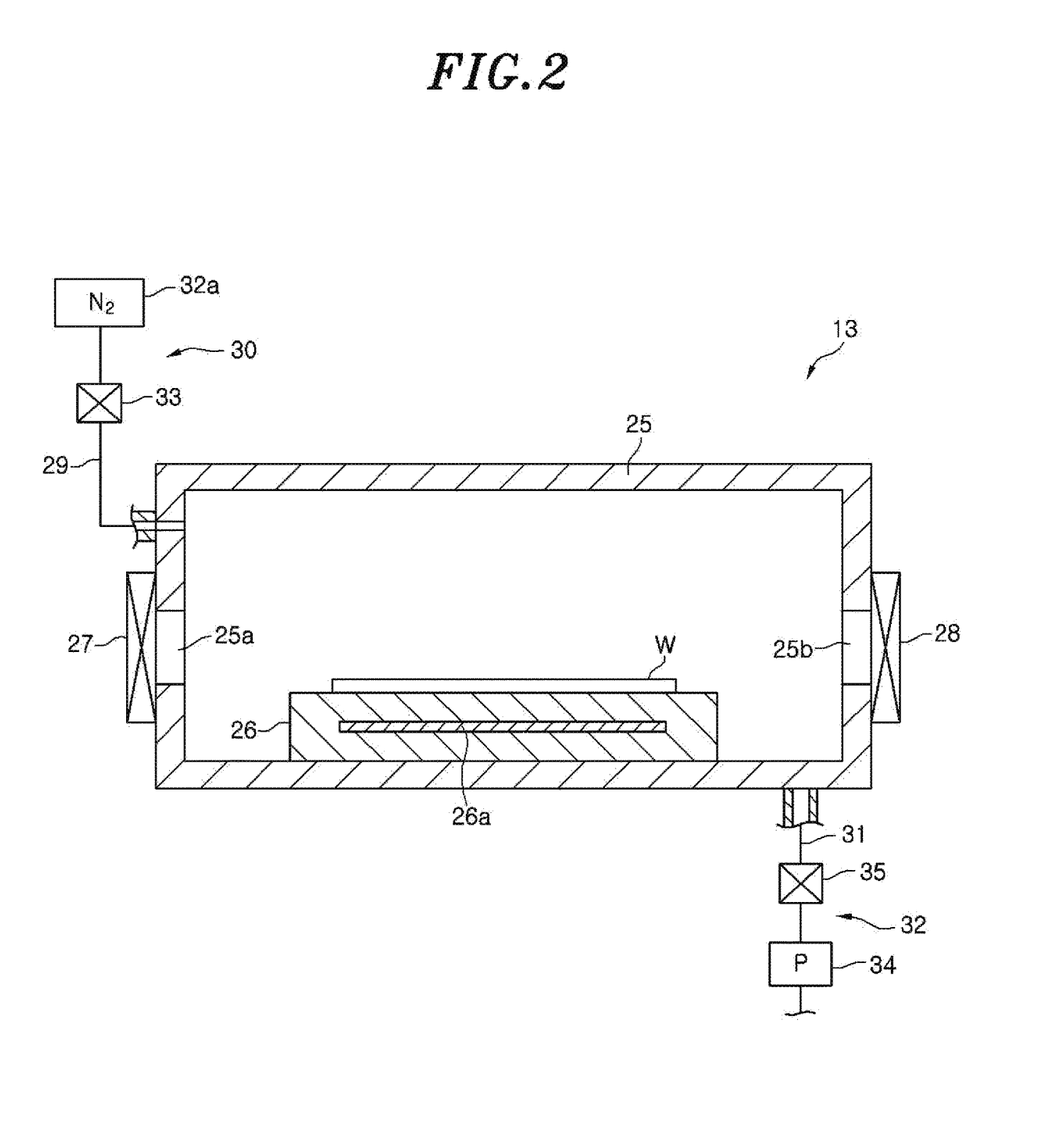
FIG. 2 is a cross sectional view schematically showing a configuration of a PHT apparatus shown in FIG. 1.

FIG. 2 is a cross sectional view schematically showing a configuration of the PHT apparatus shown in FIG. 1.

Referring to FIG. 2, the PHT apparatus 13 includes: an evacuable chamber 25; and a stage 26, provided in the chamber 25, for mounting thereon the wafer W in a substantially horizontal state. A heater 26a is buried in the stage 26. The heater 26a performs PHT processing of heating the wafer W mounted on the stage 26 and vaporizing (sublimating) a reaction product generated on the wafer W after the COR processing is performed in the PHT apparatus 13.

A loading/unloading port 25a through which the wafer W is transferred between the PHT apparatus 13 and the load-lock chamber 12 is provided at a side of the chamber 25 which faces the load-lock chamber 12. The loading/unloading port 25a is opened/closed by a gate valve 27. A loading/unloading port 25b through which the wafer W is transferred between the PHT apparatus 13 and the COR apparatus 14 is provided at a side of the chamber 25 which faces the COR apparatus 14. The loading/unloading port 25b is opened/closed by a gate valve 28.

The chamber 25 is connected to a gas supply unit 30 having a gas supply line 29 through which an inert gas, e.g., nitrogen ($N_2$) gas, is supplied and a gas exhaust unit 32 having a gas exhaust line 31 for exhausting the chamber 25. The gas supply line 29 is connected to a nitrogen gas supply source 32a and provided with a mass flow controller 33 for controlling a flow rate of the nitrogen gas. The gas exhaust line 31 is connected to a vacuum pump 34 and provided with an opening/closing valve 35 for opening/closing the gas exhaust line 31.

Figure 3:
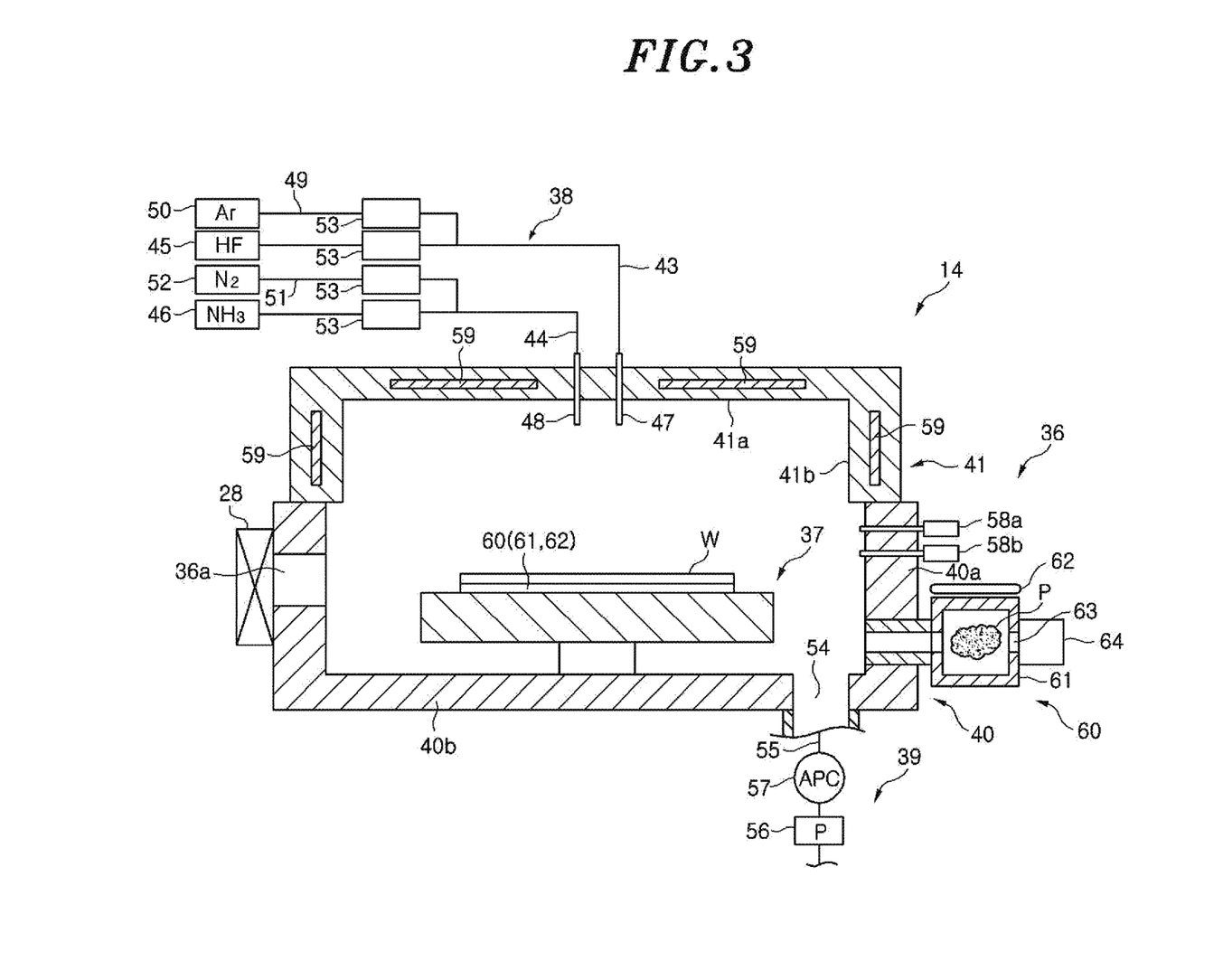
FIG. 3 is a cross sectional view schematically showing a configuration of a COR apparatus shown in FIG. 1.

FIG. 3 is a cross sectional view schematically showing a configuration of the COR apparatus shown in FIG. 1.

Referring to FIG. 3, the COR apparatus 14 includes: an airtightly sealed chamber 36; a stage 37, provided in the chamber 36, for mounting thereon the wafer W in a substantially horizontal state; a processing gas supply unit 38 for supplying a processing gas such as hydrogen fluoride (HF) gas, ammonia ($NH_3$) gas or the like into the chamber 36; and a gas exhaust unit 39 for exhausting the chamber 36. The stage 37 has therein a coolant path and a heater (both not shown). In the COR processing, the coolant path and the heater are mainly used to control a temperature of the wafer W.

The chamber 36 includes a chamber main body 40 and a cover 41. The chamber main body 40 has a substantially cylindrical sidewall 40a and a flat bottom portion 40b. An opening formed at the upper portion of the chamber main body 40 is opened/closed by the cover 41. A sealing member (not shown) is provided between the chamber main body 40 and the cover 41 to ensure the airtightness of the chamber 36. A loading/unloading port 36a through which the wafer W is transferred between the COR apparatus 14 and the PHT apparatus 13 is provided at a side of the chamber 36 which faces the PHT apparatus 13. The loading/unloading port 36a is opened/closed by a gate valve 28.

The processing gas supply unit 38 includes a first gas supply line 43, a second gas supply line 44, a hydrogen fluoride gas supply source 45 connected to the first gas supply line 43 and an ammonia gas supply source 46 connected to the second gas supply line 44. The first gas supply line 43 communicates with the inside of the chamber 36 through a first gas introduction nozzle 47 penetrating through the cover 41, and the second gas supply line 44 communicates with the inside of the chamber 36 through a second gas introduction nozzle 48 penetrating through the cover 41. A third gas supply line 49 is branched from the first gas supply line 43. The third gas supply line 49 is connected to an argon (Ar) gas supply source 50. A fourth gas supply line 51 is branched from the second gas supply line 44. The fourth gas supply line 51 is connected to a nitrogen gas supply source 52. Each of the first to the fourth gas supply line 43 to 51 is provided with a flow rate controller 53 for opening/closing each gas supply line and controlling a flow rate of a gas flowing in each gas supply line. The flow rate controller 53 includes an opening/closing valve and a mass flow controller 33. The processing gas supply unit 38 introduces the processing gas containing hydrogen fluoride gas, argon gas, ammonia gas and nitrogen gas into the chamber 36. Since, however, the hydrogen fluoride gas and the ammonia gas react with each other, these gases are separately introduced into the chamber 36 through the first gas introduction nozzle 47 and the second gas introduction nozzle 48, respectively, and then mixed in the chamber 36. The processing gas may be introduced by using a shower head instead of the first and the second gas introduction nozzle 47 and 48.

In the COR apparatus 14, a pressure in the chamber 36 is decreased to a predetermined vacuum level and an oxide film, e.g., an $SiO_2$ film, formed on a surface of the wafer W is made to react with the hydrogen fluoride gas and the ammonia gas. As a consequence, ammonium hexafluorosilicate (AFS) as a reaction product from the oxide film (COR processing). The reaction product is sublimated in the PHT apparatus 13 as described above. In other words, in the substrate processing system 10, the oxide film on the wafer W is removed by generating the reaction product in the COR apparatus 14 and sublimating the reaction product in the PHT apparatus 13. The argon gas and the nitrogen gas in the processing gas function as a dilution gas. The dilution gas is not limited thereto, and another inert gas may be used as the dilution gas.

The gas exhaust unit 39 includes a gas exhaust line 55 communicating with the gas exhaust port 54 that is opened at the bottom portion 40b, a vacuum pump 56 connected to the gas exhaust line 55 and a pressure control valve (APC) 57 for controlling a pressure in the chamber 36.

Two capacitance manometers 58a and 58b for measuring a pressure in the chamber 36 are provided at the sidewall 40a of the chamber main body 40. The two capacitance manometers 58a and 58b are manometers for measuring a high pressure and a low pressure. The cover 41 has a ceiling portion 41a facing the stage 37 and a sidewall 41b in direct contact with the sidewall 40a of the chamber main body 40. A heater 59 is buried in each of the ceiling portion 41a and the sidewall 41b. The heater 59 heats the ceiling portion 41a and the sidewall 41b to prevent adhesion of deposits on the ceiling portion 41a and the sidewall 41b.

A spectroscopic analyzer 60 for performing spectroscopic analysis of the plasma is provided at the sidewall 40a of the chamber main body 40. The spectroscopic analyzer 60 includes: a sub-chamber 61 communicating with the chamber 36 and configured to take in the gas in the chamber 36; an ICP antenna 62 for generating an inductively coupled plasma from the gas taken in the sub-chamber 61 by generating an electric field in the sub-chamber 61; and a spectroscopic measuring device 64 for measuring emission of the inductively coupled plasma in the sub-chamber 61 through an observation window 63 provided at a sidewall of the sub-chamber 61. In the spectroscopic analyzer 60, the spectroscopic measuring device 64 measures the luminous intensity in each wavelength in the emission spectrum of the plasma and observes the state of the chamber 36 and further the surface state of the wafer W. Specifically, when AFS is generated in the COR processing, moisture is released and, thus, the spectroscopic measuring device 64 measures the luminous intensity of the wavelength (e.g., wavelength of 308 nm) corresponding to a hydroxyl group in the emission spectrum of the inductively coupled plasma and observes the progress of the COR processing.

In the case of performing predetermined processing, e.g., an etching process, on the wafer, the processing gas is introduced into the chamber (a plasma being generated in some cases) and, then, the processing target film of the wafer is etched. Generally, a time difference exists between the introduction of the processing gas and the actual etching of the processing target film. This time difference is referred to as "incubation time". The incubation time depends on the surface state of the wafer, e.g., the distribution of residue covering the processing target film, and the condition of the etching apparatus.

Therefore, the present inventors have examined the effect of the surface state of the wafer on the incubation time before. Specifically, when the COR processing was performed on two wafers at the same time in a COR apparatus having a similar configuration to that of the COR apparatus 14, the progress of the COR processing was observed by the spectroscopic analyzer 60 for combination of two wafers having exposed silicon oxide films (hereinafter, referred to as "combination 1"), combination of a wafer having an exposed silicon oxide film and a wafer having a silicon oxide film covered with a thin natural oxide film and a residue (hereinafter, referred to as "combination 2"), and combination of two wafers having silicon oxide films covered with a natural oxide film and a residue (hereinafter, referred to as "combination 3"). Then, the incubation time from the introduction of hydrogen fluoride gas and ammonia gas into the chamber 36 to the start of generation of ARF from the oxide film was measured.

Figure 4:
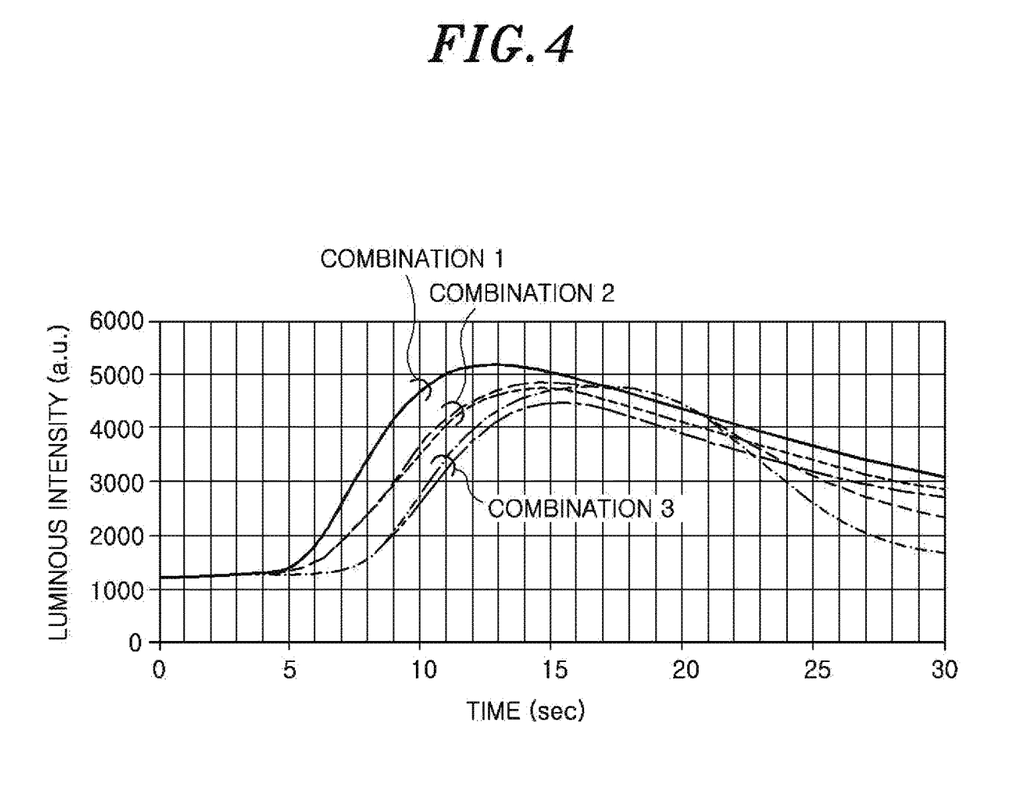
FIG. 4 is a graph showing changes in an incubation time in the case of changing combination of two wafers.

FIG. 4 is a graph showing changes in the incubation time in the case of changing the combination of two wafers.

In FIG. 4, the spectroscopic measurement device 64 of the spectroscopic analyzer 60 measures the luminous intensity of the wavelength corresponding to the hydroxyl group in the emission spectrum of the inductively coupled plasma. The luminous intensity of the corresponding wavelength is abruptly increased only when the release of moisture (hydroxyl group) from the oxide film of the wafer is started, i.e., when the generation of AFS from the oxide film is started. Therefore, the moment when the luminous intensity of the wavelength is abruptly increased becomes the end point of the incubation time.

As can be seen from the graph of FIG. 4, the incubation time varies depending on the combination and is increased as the area in which an oxide silicon film of the wafer is covered with a residue or the like is increased. This is considered because as the area of the wafer which is covered with the residue or the like is increased, the time required for exposure of the silicon oxide film is increased and the moment when the generation of AFS from the oxide film is started is delayed.

Figure 5:
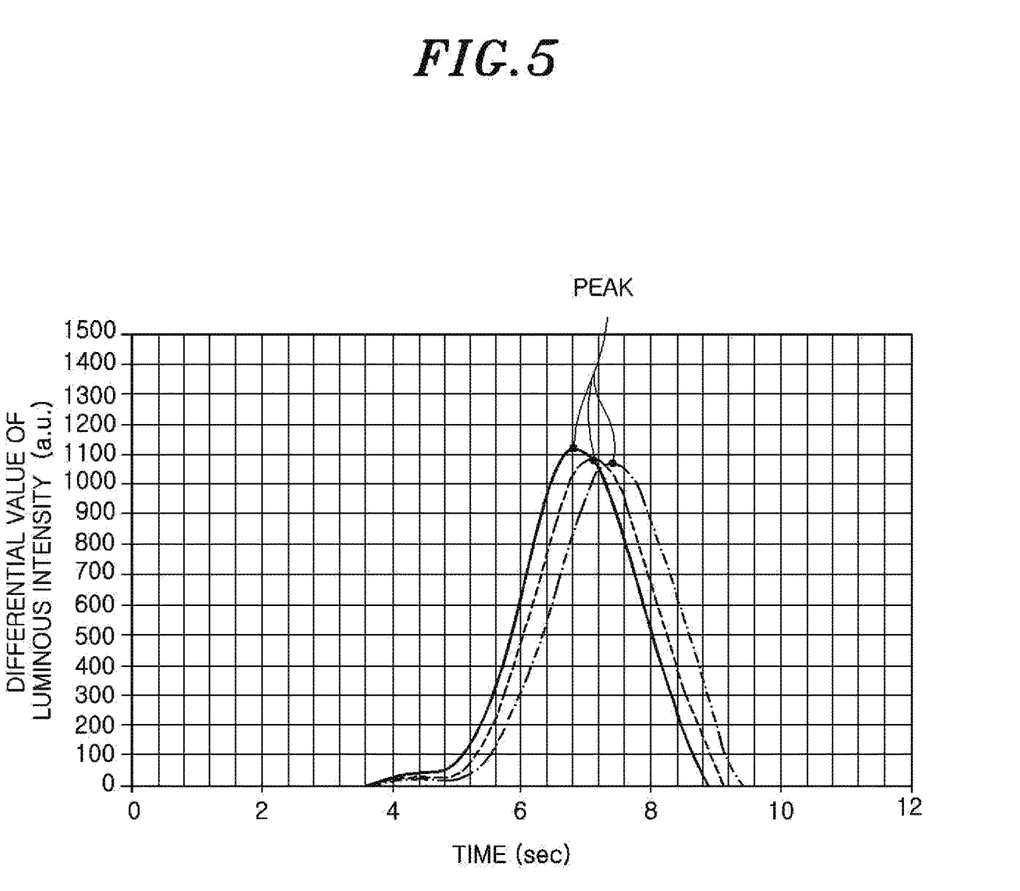
FIG. 5 is a graph for explaining determination of an end point of the incubation time.

In the above, the moment when the luminous intensity is abruptly increased was set to the end point of the incubation time. However, in the present embodiment, in order to improve the detectability of the end point of the incubation time, the moment when a differential value of the luminous intensity reaches a peak is set to an end point detection reference point of the incubation time as shown in FIG. 5. The end point detection reference point of the incubation time may be the moment when the luminous intensity exceeds a predetermined threshold value or the moment when the differential value of the luminous intensity exceeds the predetermined threshold value.

Next, the present inventors prepared a plurality of wafers having different Q-times and performed the COR processing on each of the wafers. Then, the incubation time from the introduction of hydrogen fluoride gas and ammonia gas into the chamber 36 to the start of generation of AFS from the oxide film was observed.

Figure 6:
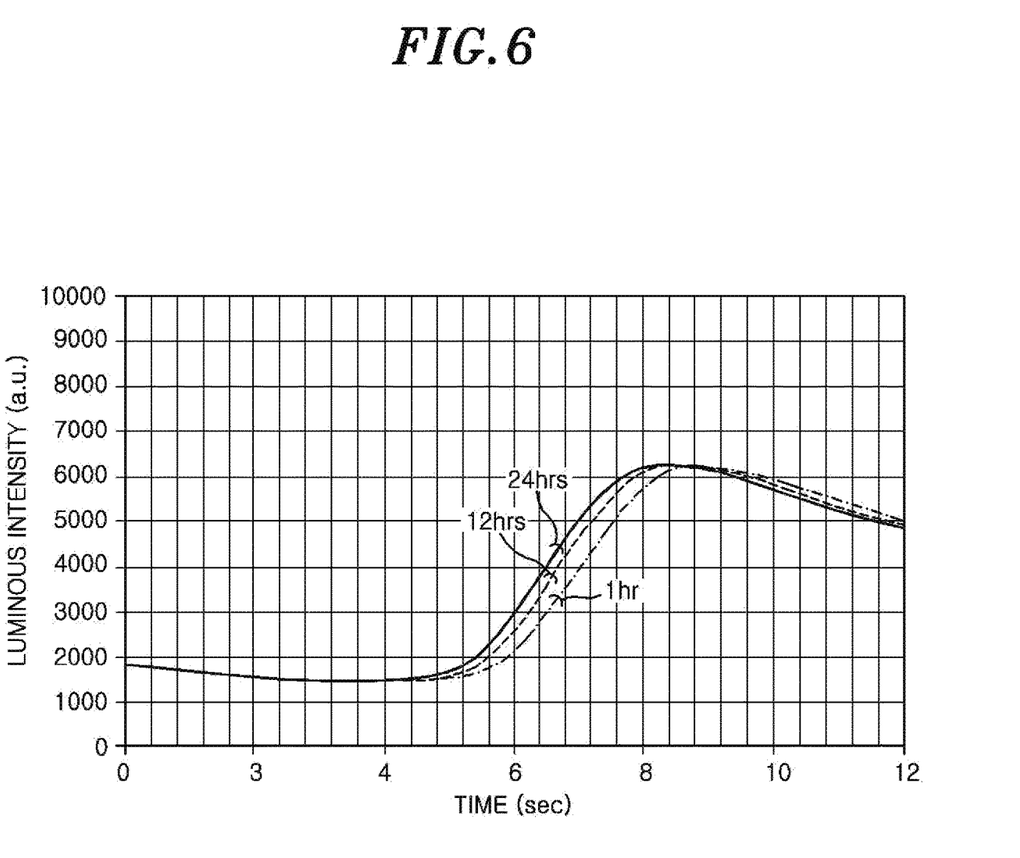
FIG. 6 is a graph showing changes in the incubation time in the case of changing Q-time.

FIG. 6 is a graph showing changes in the incubation time in the case of changing the Q-time. In FIG. 6, the moment when the luminous intensity of the wavelength corresponding to the hydroxyl group was abruptly increased was set to the end point of the incubation time. A wafer having a Q-time of 24 hours, a wafer having a Q-time of 12 hours and a wafer having a Q-time of one hour were prepared as a plurality of wafers having different Q-times. At this time, in the COR processing, the flow rates of hydrogen fluoride gas, ammonia gas and argon gas were set to 100 sccm to 500 sccm, 20 sccm to 100 sccm and 40 sccm to 800 sccm, respectively. A pressure in the chamber 36 was set to 100 mTorr to 700 mTorr. A temperature of the heater 59 was set to 75° C. to 85° C. A processing time was set to 14 sec.

As can be seen from the graph of FIG. 6 and the following Table 1, the incubation time is changed as the Q-time is changed, and the incubation time is decreased as the Q-time is increased. This is considered because as the Q-time is increased, fluorine termination of the oxide film of the wafer is advanced by fluorine of AFS forming the residue. Further, the period of time in which the oxide film absorbs moisture in the air is increased and, thus, the moisture of the oxide film is increased and the oxide film easily reacts with hydrogen fluoride gas and ammonia gas.

TABLE 1

| Q-time (hr) | Incubation time (sec) |
| --- | --- |
| 24 | 6.8 |
| 12 | 7.1 |
| 1 | 7.4 |

The present inventors observed the amount of generated AFS (i.e., etching amount) in each wafer in the case of performing the COR processing on the wafers having different Q-times. At this time, in the COR processing, the flow rates of hydrogen fluoride gas, ammonia gas and argon gas were set to 100 sccm to 500 sccm, 20 sccm to 100 sccm and 40 sccm to 800 sccm, respectively. A pressure in the chamber 36 was set to 100 mTorr to 700 mTorr. A temperature of the heater 59 was set to 75° C. to 85° C. A processing time was set to 14 sec.

Figure 7:
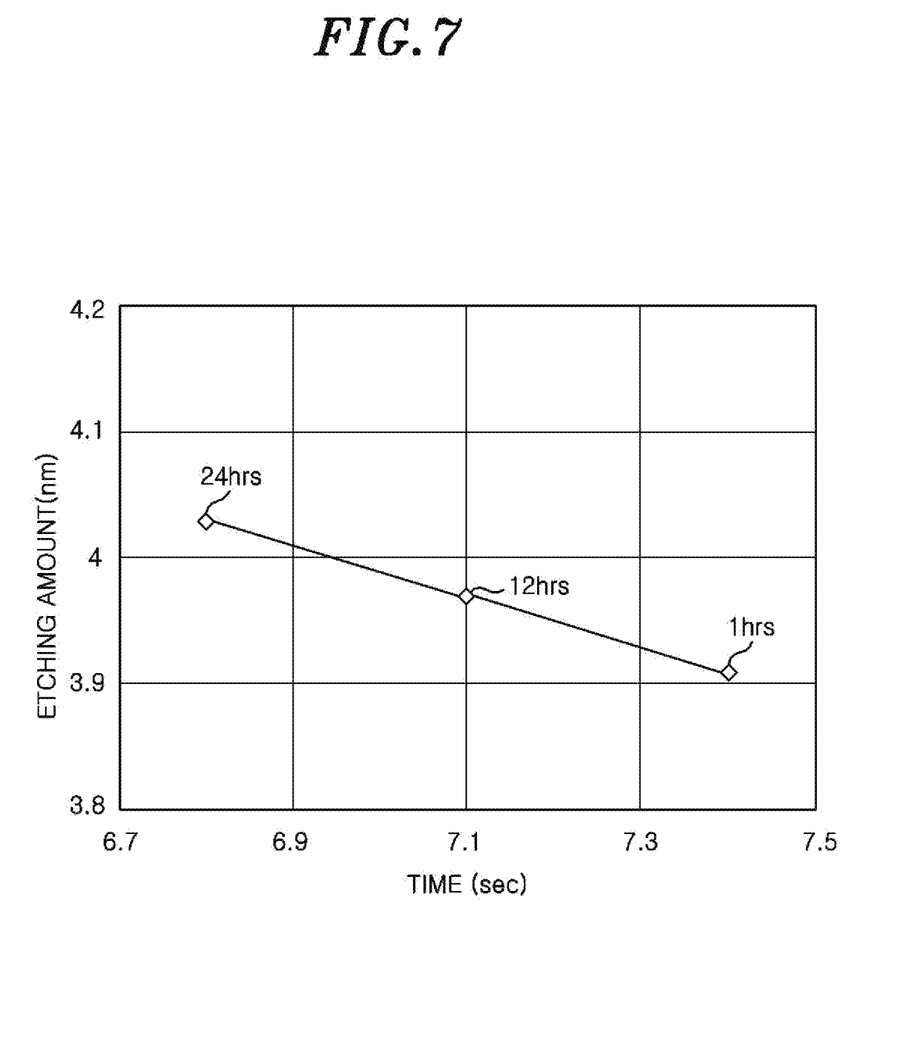
FIG. 7 is a graph showing changes in an etching amount in the case of changing the Q-time.

As can be seen from the graph of FIG. 7 and the following Table 2, the etching amount varies as the Q-time is changed, and the etching amount is increased as the Q-time is increased. This is considered because the incubation time (14 sec: incubation time) is decreased as the Q-time is increased as described above and, thus, the period of time in which AFS is actually generated is increased and the amount of generated AFS is increased. In the graph of FIG. 7, the horizontal axis represents the incubation time.

TABLE 2

| Q-time (hr) | Etching amount (nm) |
| --- | --- |
| 24 | 4.03 |
| 12 | 3.97 |
| 1 | 3.91 |

From the above, it is assumed that the etching amounts in the wafers are different because the incubation time is different between the wafers and the period of time in which AFS is actually generated is different between the wafers. The present inventors corrected the processing time of the COR processing in the wafers having different Q-times while considering the incubation time in order to examine the assumption. In other words, the period of time in which AFS is actually generated was set to be the same in the wafers by decreasing the processing time of the COR processing as the Q-time is increased (as the incubation time is decreased). Specifically, the processing time of the COR processing in the wafer having the Q-time of 12 hours was set to be shorter than that in the wafer having the Q-time of one hour by about 0.3 sec. The processing time of the COR processing in the wafer having the Q-time of 24 hours was set to be shorter than that in the wafer having the Q-time of one hour by about 0.6 sec. Thereafter, the COR processing was performed on each wafer and the etching amount in each wafer was observed. At this time, in the COR processing, the flow rates of hydrogen fluoride gas, ammonia gas and argon gas were set to 100 sccm to 500 sccm, 20 sccm to 100 sccm and 40 sccm to 800 sccm, respectively. A pressure in the chamber 36 was set to 100 mTorr to 700 mTorr. The temperature of the heater 59 was set to 75° 5 to 85° C. The processing time of the wafer having the Q-time of one hour was set to 14 sec.

Figure 8:
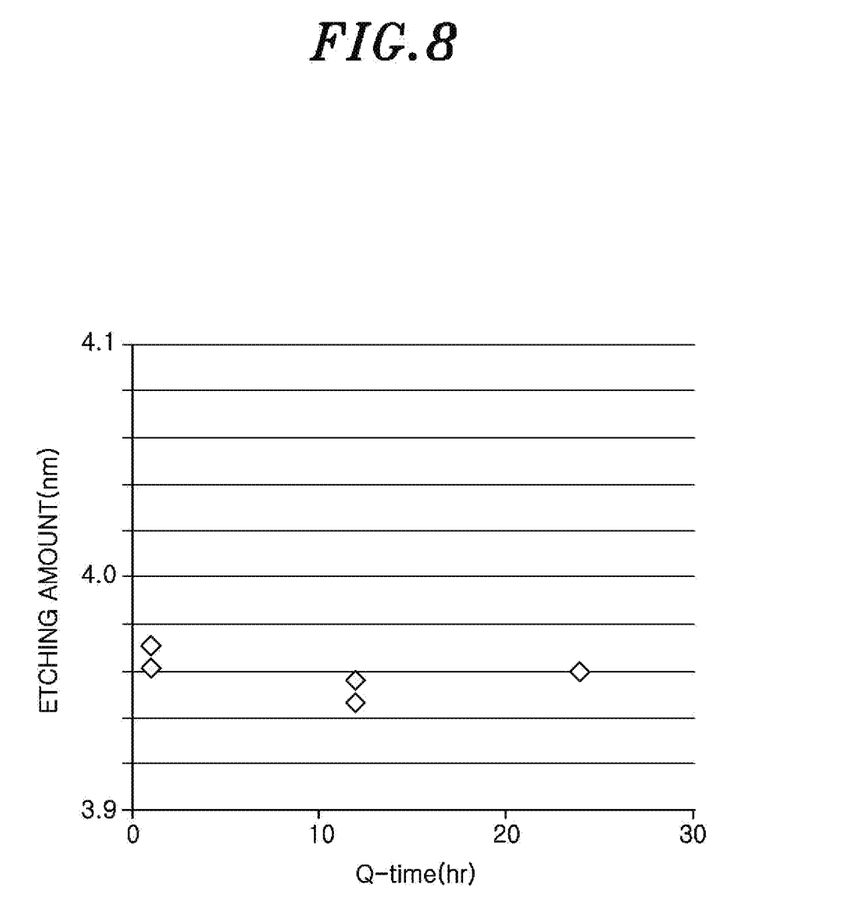
FIG. 8 is a graph showing an etching amount in the case of correcting a processing time of COR processing for wafers having different Q-times in consideration of the incubation time.

FIG. 8 is a graph showing the etching amount in the case of correcting the processing time of the COR processing in wafers having different Q-times in consideration of the incubation time.

As shown in FIG. 8, the variation of the etching amount can be prevented and the etching amount in the wafers can become the same by decreasing the processing period of the COR processing as the Q-time is increased (as the incubation time is decreased). For example, in the graph shown in FIG. 8, the variation of the etching amount was only ±0.3%.

From the above, it is clear that the variation of the etching amount can be prevented and, further, the generation of AFS from the oxide film can be accurately controlled by detecting the end point of the incubation time, i.e., the AFS generation start point, and making the period of time in which AFS is actually generated coincide with the detected AFS generation start point. The present disclosure is based on the above knowledge.

Next, the COR processing as the substrate processing method according to an embodiment will be described.

Figure 9:
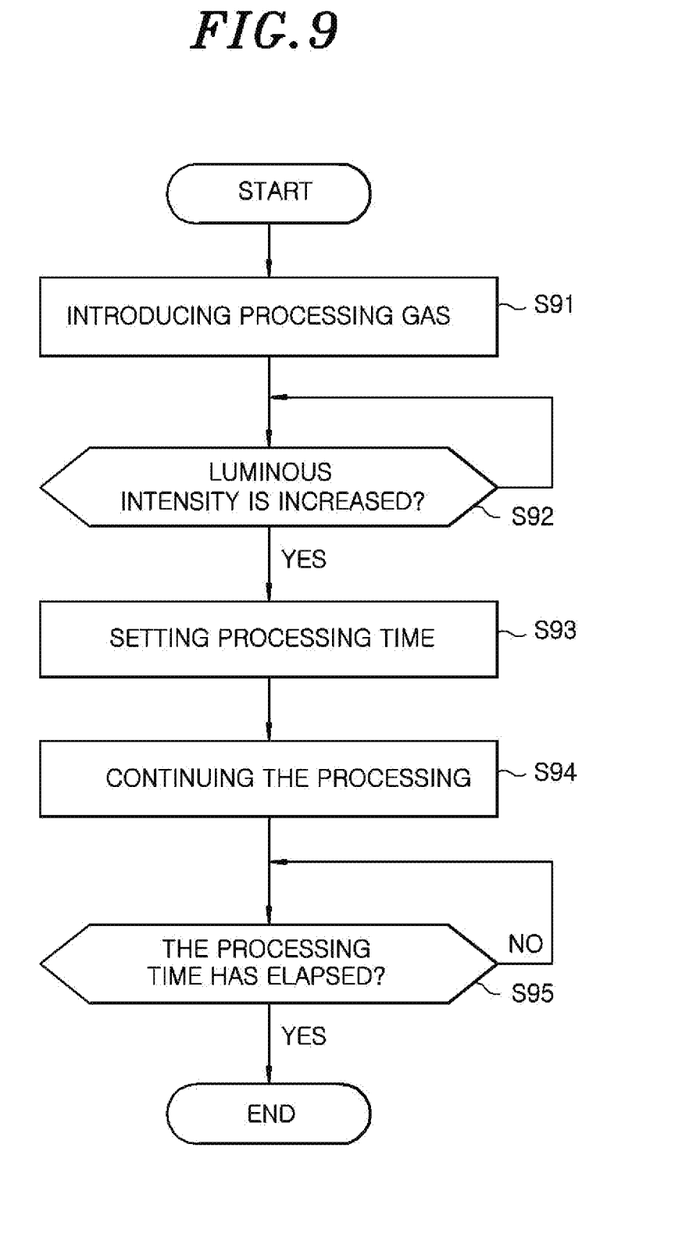
FIG. 9 is a flowchart showing a sequence of the COR processing as a substrate processing method according to a first embodiment.

FIG. 9 is a flowchart showing a sequence of the COR processing as the substrate processing method according to an embodiment. This processing is performed whenever the COR processing is performed in the COR apparatus 14. FIGS. 10A to 10D are partial cross sectional views of a wafer which explain the processing shown in FIG. 9.

Referring to FIG. 9, first, the chamber 36 is exhausted by the gas exhaust unit 39 so that a pressure in the chamber 36 is decreased to a predetermined vacuum level, and the processing gas is introduced into the chamber 36 by the processing gas supply unit 38 (step S91). At this time, a temperature of the wafer W is controlled by the stage 37 to a level suitable for the COR processing.

Figure 10A:
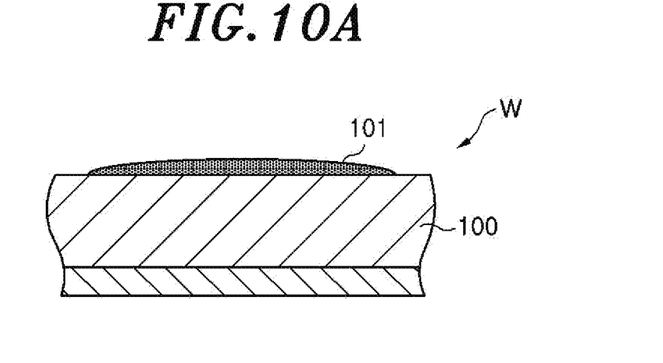
FIGS. 10A to 10D are partial cross sectional views of a wafer which explain the processing shown in FIG. 9.

After the processing gas is introduced into the chamber 36, the gas in the chamber 36 is taken in the sub-chamber 61 in the spectroscopic analyzer 60 and an inductively coupled plasma is generated from the taken-in gas by the ICP antenna 62. The spectroscopic measuring device 64 measures the luminous intensity of the wavelength corresponding to the hydroxyl group in the emission spectrum of the inductively coupled plasma. At this time, as shown in FIG. 10A, a residue 101 such as AFS or the like exists on a surface of an oxide film 100 of the wafer W. The residue 101 suppresses generation of AFS from the oxide film 100 until the residue 101 is removed by heat or the like. Thus, even if the processing gas is introduced into the chamber 36, the immediate generation of AFS from the oxide film 100 does not occur and the luminous intensity of the wavelength corresponding to the hydroxyl group is not increased. Next, it is determined whether or not the luminous intensity of the wavelength corresponding to the hydroxyl group is abruptly increased, i.e., whether or not the incubation time has reached the end point (step S92). As described above, in the processing shown in FIG. 9, the moment when the differential value of the luminous intensity of the wavelength corresponding to the hydroxyl group has reached the peak is set to the end point detection reference point of the incubation time.

Figure 10B:
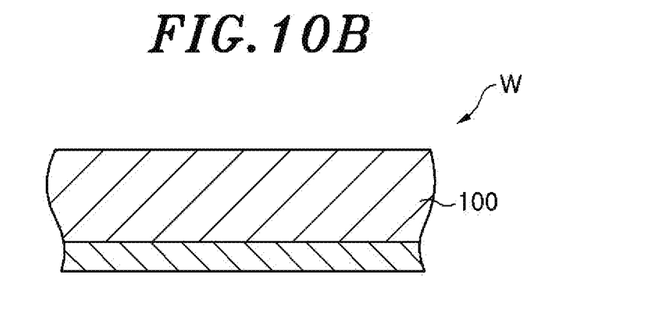
Figure 10C:
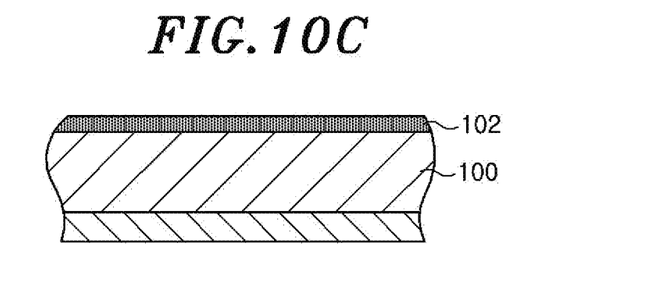

When it is determined in the step S92 that the abrupt increase in the luminous intensity of the wavelength corresponding to the hydroxyl group does not occur, the processing repeats the step S92. When the oxide film 100 is entirely exposed by removal of the residue 101 as shown in FIG. 10B and the luminous intensity of the wavelength corresponding to the hydroxyl group is abruptly increased by the start of generation of AFS from the oxide film 100, the processing time of the COR processing performed after the moment when the luminous intensity of the wavelength corresponding to the hydroxyl group is abruptly increased, i.e., the end point detection reference point of the incubation time, is set (step S93) and the COR processing is continued for the set time (step S94). While the COR processing is being continued, the generation of AFS 102 from the oxide film 100 is continued as shown in FIG. 10C.

The processing time of the COR processing which is set in the step S93 is not particularly limited. For example, it may be a processing time that is enough to make the entire oxide film 100 react and generate AFS (i.e., enough to etch the entire oxide film 100) or may be a processing time that is required to make only a part of the oxide film 100 react and generate AFS (i.e., required to etch only a part of the oxide film 100). In the present embodiment, in the step S93, the processing time required to make only a part of the oxide film 100 react and generate AFS is set. As described above, the processing shown in FIG. 9 is performed whenever the COR processing is performed. Whenever the processing shown in FIG. 9 is performed, the same period of time is set as the processing time of the COR processing. Accordingly, whenever the processing shown in FIG. 9 is performed, the same period of time is set as the processing time of the COR processing performed after the end point detection reference point of the incubation time.

Figure 10D:
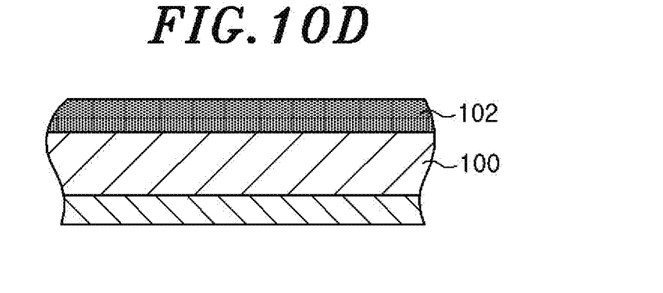

Next, it is determined whether or not the processing time of the COR processing which is set in the step S93 has elapsed (step S95). When the set processing time of the COR processing has not elapsed, the processing returns to the step S95. When the set processing time of the COR processing has elapsed, this processing is completed. When the set processing time of the COR processing has elapsed, only a part of the oxide film 100 reacts and becomes the AFS 102 as shown in FIG. 10D.

In the processing shown in FIG. 9, the processing time of the COR processing performed after the moment when the luminous intensity of the wavelength corresponding to the hydroxyl group in the emission spectrum of the inductively coupled plasma generated from the gas in the chamber 36 is abruptly increased, i.e., the end point of the incubation time, is set. Whenever the processing shown in FIG. 9 is performed, the same period of time is set as the processing time of the COR processing. Accordingly, even if the incubation time is different between wafers W having different distribution of the residue 101 or the like, the period of time in which the AFS 102 is actually generated can be constant. As a result, the variation of the etching amount of the oxide film 100 in the wafer W can be prevented, and the etching amount of the oxide film 100 can be accurately controlled.

Further, in the processing shown in FIG. 9, the luminous intensity of the wavelength corresponding to the hydroxyl group is measured after the introduction of the processing gas into the chamber 36. Therefore, the luminous intensity of the wavelength corresponding to the hydroxyl group is measured before the generation of AFS from the oxide film 100. Accordingly, it is possible to prevent the moment when the generation of AFS from the oxide film 100 is started from being overlooked.

Moreover, in the processing shown in FIG. 9, the moment when the differential value of the luminous intensity of the wavelength corresponding to the hydroxyl group has reached the peak is set to the end point detection reference point of the incubation time. The peak of the differential value can be accurately detected by further differentiating the differential value of the luminous intensity of the wavelength corresponding to the hydroxyl group. Accordingly, it is possible to reliably prevent the missing of the end point detection reference point of the incubation time.

Furthermore, in the processing shown in FIG. 9, the processing time set after the end point detection reference point of the incubation time is the processing time required to etch only a part of the oxide film 100. Therefore, even when the oxide film 100 is not entirely etched, the etching amount of the oxide film 100 can be accurately controlled. Conventionally, there is suggested an end point detection method in which the moment when the luminous intensity of a predetermined wavelength is abruptly changed is set to the end point of the etching process because the luminous intensity of the predetermined wavelength in the emission spectrum of the plasma is changed due to changes in the distribution and the density of the gas and the reaction product released from the wafer when the processing target film is etched and another film is exposed. Since, however, it is premised in the end point detection method that the processing target film is entirely etched and another film is exposed, the end point detection method cannot be applied to the case of terminating the etching process without completely etching the entire processing target film as in the processing shown in FIG. 9. In other words, the processing shown in FIG. 9 can be applied to the case of terminating the etching process without completely etching the entire oxide film 100 and thus is advantageous compared to the conventional end point detection method.

The incubation time depends on the condition of the etching apparatus as well as the surface state of the wafer. Since the processing time of the COR processing performed after the end point of the incubation time is set in the processing shown in FIG. 9, the etching amount of the oxide film 100 can be accurately controlled even if the incubation time is not uniform due to any reason.

Hereinafter, a second embodiment of the present disclosure will be described.

The second embodiment is different from the first embodiment in that the moment detected by the spectroscopic analyzer 60 is not the end point of the incubation time but the moment when the amount of generated AFS is considerably changed. The other configurations and operations of the second embodiment are basically the same as those of the first embodiment. Therefore, redundant description thereof will be omitted and only differences will be described hereinafter.

Figure 11A:
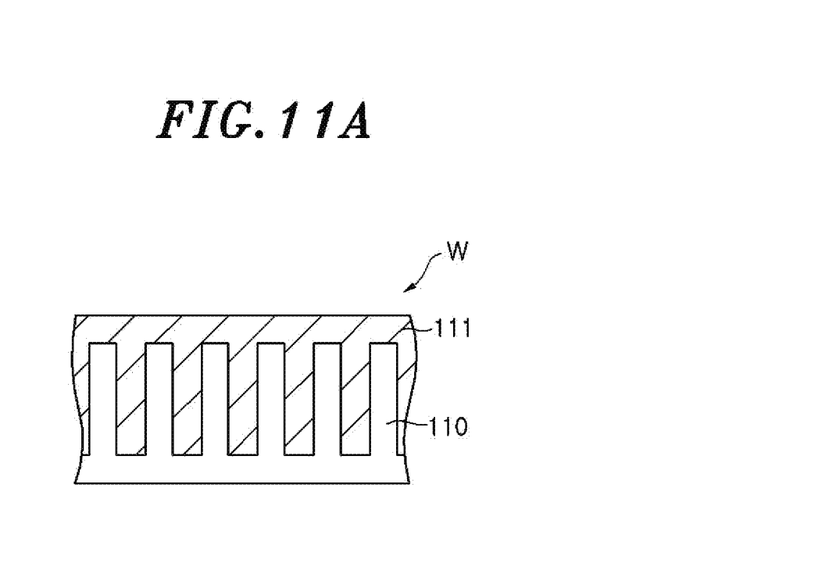
Figure 11B:
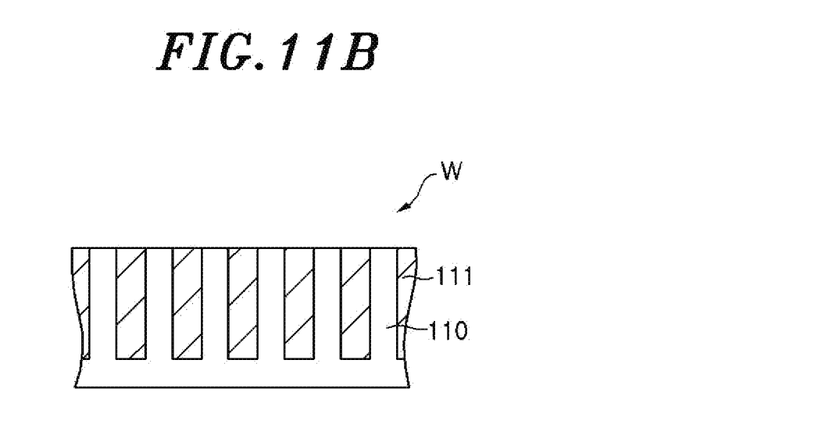

In the case of performing the COR processing on the oxide film 111 of the wafer W in which a plurality of fin structures 110 are buried as shown in FIG. 11A, when the tip end portions of the fin structures 110 are exposed by removing the oxide film 111 on the fin structures 110 as shown in FIG. 11B, the area of the exposed oxide film 111 is relatively decreased. Therefore, the amount of generated AFS is considerably decreased and the amount of moisture released from the oxide film 111 is considerably decreased. Accordingly, in the case of performing the COR processing on the wafer W shown in FIG. 11A by the COR apparatus 14, the moment when the tip end portions of the fin structures 110 are exposed can be detected by allowing the spectroscopic measuring device 64 of the spectroscopic analyzer 60 to detect the abrupt decrease in the luminous intensity of the wavelength corresponding to the hydroxyl group in the emission spectrum of the inductively coupled plasma generated from the gas in the chamber 36. Even when the oxide film 111 covering the tip end portions of the fin structures 110 is entirely turned into the AFS, the moment when the oxide film 111 covering the tip end portions of the fin structures 110 is entirely turned into the AFS 112 can be detected by detecting the abrupt decrease in the luminous intensity of the wavelength corresponding to the hydroxyl group because only the oxide film 111 between the fin structures 110 is turned into the AFS 112. Therefore, in the present embodiment, the moment when the oxide film 111 covering the tip end portions of the fin structures 110 is entirely turned into the AFS 112 is detected and the processing time of the COR processing performed after the detected moment is set.

FIGS. 12A to 12D are partial cross sectional views of the wafer which explain the substrate processing method of the present embodiment. The substrate processing method is performed by the COR apparatus 14.

First, the chamber 36 is exhausted by the gas exhaust unit 39 and a pressure in the chamber 36 is decreased to a predetermined vacuum level. The processing gas is introduced into the chamber 36 by the processing gas supply unit 38. At this time, the temperature of the wafer W shown in FIG. 11A is controlled by the stage 37 to a level suitable for the COR processing.

Figure 12A:
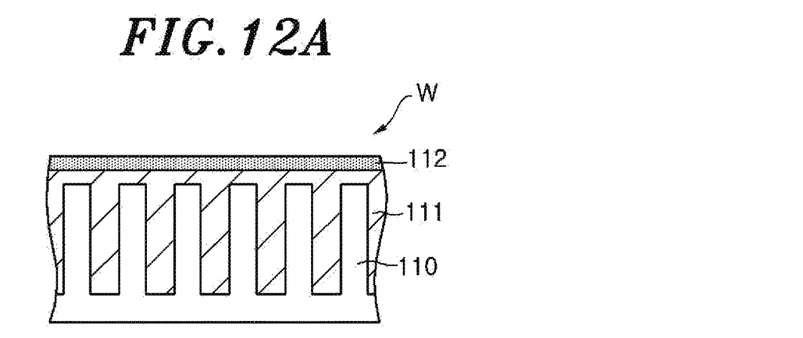
FIGS. 12A to 12D are partial cross sectional views of the wafer which explain a substrate processing method according to a second embodiment.

After the processing gas is introduced into the chamber 36, the gas in the chamber 36 is taken in the sub-chamber 61 of the spectroscopic analyzer 60 and an inductively coupled plasma is generated from the taken-in gas by the ICP antenna 62. The spectroscopic measuring device 64 measures the luminous intensity of the wavelength corresponding to the hydroxyl group in the emission spectrum of the inductively coupled plasma. At this time, as shown in FIG. 12A, the generation of the AFS 112 from the surface of the oxide film 111 of the wafer W is started. The COR processing is continued and the generation of the AFS 112 from the oxide film 111 is continued.

Next, it is determined whether or not the luminous intensity of the wavelength corresponding to the hydroxyl group is abruptly decreased, i.e., whether or not the oxide film 111 covering the tip end portions of the fin structures 1110 is entirely turned into the AFS 112.

Figure 12B:
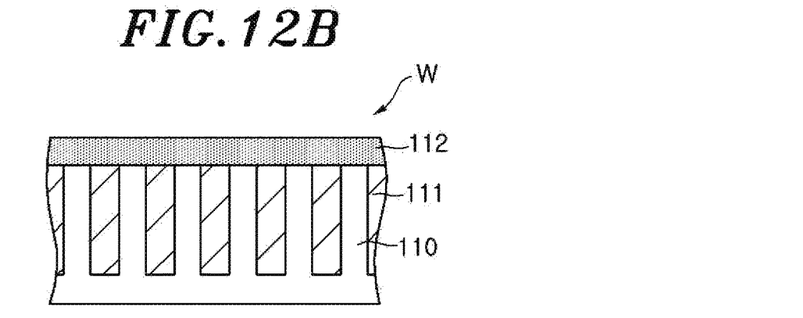
Figure 12C:
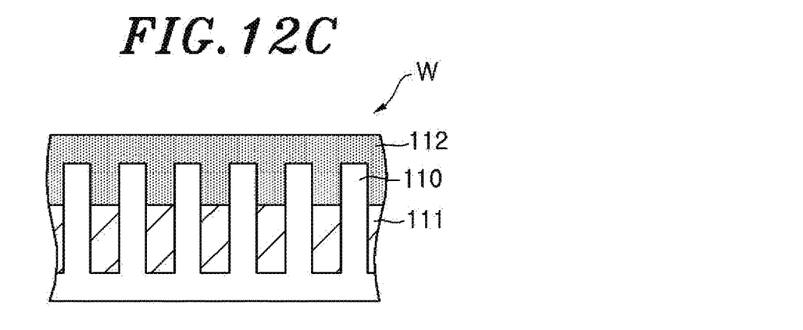

As shown in FIG. 12B, when the oxide film 111 covering the tip end portions of the fin structures 110 is entirely turned into the AFS 112 and the luminous intensity of the wavelength corresponding to the hydroxyl group is abruptly decreased, the processing time of the COR processing performed after the moment when the luminous intensity of the wavelength corresponding to the hydroxyl group is abruptly decreased, i.e., the moment when the oxide film 111 covering the tip end portions of the fin structures 110 is turned into the AFS 112, is set and the COR processing is continued for the set time. While the COR processing is continued, the generation of the AFS 112 from the oxide film 111 is continued as shown in FIG. 12C. In the present embodiment, the processing time required to make only a part of the oxide film 111 react and generates the AFS 112 is set. The processing shown in FIGS. 12A to 12D is performed whenever the COR processing is performed. Whenever the processing shown in FIGS. 12A to 12D is performed, the same period of time is set as the processing time of the COR processing. Accordingly, whenever the processing shown in FIGS. 12A to 12D is performed, the same period of time is set as the processing time of the COR processing performed after the moment when the oxide film 111 covering the tip end portions of the fin structures 110 is entirely turned into the AFS 112.

Figure 12D:
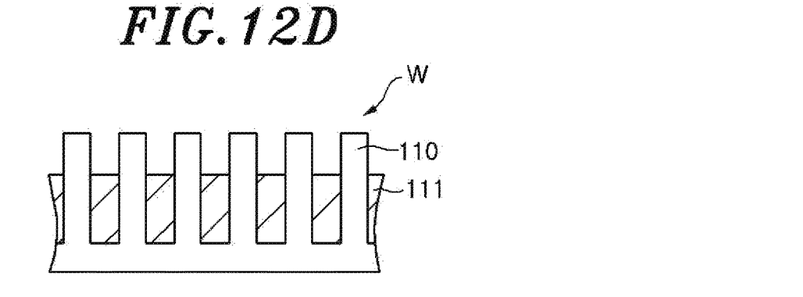

Next, it is determined whether or not the preset processing time of the COR processing has elapsed. When the preset processing time of the COR processing has elapsed, this processing is completed and the generated AFS 112 is removed by the PHT processing as shown in FIG. 12D.

In the processing shown in FIGS. 12A to 12D, the processing time of the COR processing performed after the moment when the luminous intensity of the wavelength corresponding to the hydroxyl group in the emission spectrum of the inductively coupled plasma generated from the gas in the chamber 36 is abruptly increased, i.e., the moment when the oxide film 111 covering the tip end portions of the fin structures 110 is entirely turned into the AFS 112, is set. Whenever the processing shown in FIGS. 12A to 12D is performed, the same period of time is set as the processing time of the COR processing. Accordingly, the period of time in which the AFS 112 is generated between the fin structures 110 can be constant in the wafers W having the oxide films 111 having different thicknesses and covering the tip end portions of the fin structures 110. As a result, the variation of the etching amount of the oxide film 111 between the fin structures 110 in the wafer W can be prevented, and the etching amount of the oxide film 111 of the fin structures 110 can be accurately controlled.

While the embodiments of the present disclosure have been described, the present disclosure is not limited to the above embodiments.

For example, in the above embodiments, the COR apparatus 14 that does not generate a plasma in the chamber 36 is used. However, in the case of generating a plasma in the chamber and performing plasma processing, e.g., film formation and etching, on the processing target film by the plasma, the distribution and the density of the gas and the reaction product scattering in the chamber are changed when the residue on the surface of the processing target film is removed. At this time, the luminous intensity of a predetermined wavelength in the emission spectrum of the plasma generated in the chamber is changed. Therefore, in the processing apparatus for generating a plasma in the chamber, the moment when the residue on the surface of the processing target film is removed and the plasma processing of the processing target film is started may be detected by measuring the luminous intensity of the predetermined wavelength in the emission spectrum of the plasma generated in the chamber.

The object of the disclosure can also be realized by supplying a storage medium in which a program code of software that realizes the functions of the above-described embodiments is stored to the control unit 21 of the substrate processing system 10, and causing the process controller 22 of the control unit 21 to read out and execute the program code stored in the storage medium.

In this case, the program code itself read out from the storage medium realizes the functions of the above-described embodiments and, thus, the program code and the storage medium in which the program code is stored constitute the present disclosure.

The storage medium for supplying the program code may be, e.g., a RAM, a NVRAM, a floppy (registered trademark) disk, a hard disk, a magneto-optical disk, an optical disk such as CD-ROM, CD-R, CD-RW, DVD (DVD-ROM, DVD-RAM, DVD-RW, DVD+RW), a magnetic tape, a non-volatile memory card, another ROM or the like which may store the program code. Alternatively, the program code may be downloaded from another computer (not shown), database or the like connected to the Internet, a commercial network or a local area network and then supplied to the control unit 21.

The functions of the above-described embodiments may be realized not only by executing the program code read out by the control unit 21 but also by causing an OS (operating system) or the like which operates in the process controller 22 to perform a part or all of actual operations based on instructions of the program code.

The functions of the above-described embodiments may also be realized by storing the program code read out from the storage medium in a memory provided for a functional extension board inserted into the control unit 21 or a function extension unit connected to the control unit 21 and then causing the CPU provided for the functional extension board or the function extension unit to perform a part or all of the actual operations based on the instructions of the program code.

The program code may be an object code, a program code executed by an interpreter, script data supplied to the OS, or the like.

While the disclosure has been shown and described with respect to the embodiments, it will be understood by those skilled in the art that various changes and modifications may be made without departing from the scope of the disclosure as defined in the following claims.

What is claimed is:

1. A substrate processing method for performing predetermined processing on a substrate accommodated in a processing chamber, the substrate having a processing target film, the method comprising:

measuring, as a luminous intensity of a predetermined wavelength in an emission spectrum of a plasma generated from a processing gas in the chamber, the luminous intensity of the predetermined wavelength which starts to change when actual processing of the processing target film is started; and setting a processing time of the predetermined processing to be performed after a moment when the luminous intensity of the predetermined wavelength which is measured in said measuring the luminous intensity is changed, wherein the predetermined processing is an etching process, and wherein the processing time is a period of time in which only a part of the processing target film is etched such that the substrate or a film under the processing target film is not exposed.

2. The substrate processing method of claim 1, wherein in said measuring the luminous intensity, the luminous intensity of the predetermined wavelength is measured at least after the introduction of the processing gas into the processing chamber.

3. The substrate processing method of claim 1, wherein in said measuring the luminous intensity, a differential value of the luminous intensity of the predetermined wavelength is measured, and in said setting the processing time, a moment when the differential value has reached a peak is set to the moment when the luminous intensity of the predetermined wavelength is changed.

4. The substrate processing method of claim 1, wherein the processing target film is an oxide film and the predetermined processing is COR processing.

5. A non-transitory storage medium storing a program for operating on a computer and controlling a substrate processing apparatus, when the program is executed, the program makes the computer control the substrate processing device to perform a substrate processing method for performing predetermined processing on a substrate accommodated in a processing chamber, the substrate having a processing target film, the method comprising:

measuring, as a luminous intensity of a predetermined wavelength in an emission spectrum of a plasma generated from a processing gas in the chamber, the luminous intensity of the predetermined wavelength which starts to change when actual processing of the processing target film is started; and setting a processing time of the predetermined processing to be performed after a moment when the luminous intensity of the predetermined wavelength which is measured in said measuring the luminous intensity is changed, wherein the predetermined processing is an etching process, and wherein the processing time is a period of time in which only a part of the processing target film is etched such that the substrate or a film under the processing target film is not exposed.

* * * * *